United States Patent
Fukuda et al.

(10) Patent No.: US 6,778,568 B1
(45) Date of Patent: Aug. 17, 2004

(54) SEMICONDUCTOR MODULE AND METHOD OF MOUNTING SEMICONDUCTOR LASER ELEMENT ON THE SAME

(75) Inventors: Shinnosuke Fukuda, Tsurugashima (JP); Masaki Okayasu, Tsurugashima (JP); Hirofumi Tanaka, Tsurugashima (JP); Takeshi Ishida, Tsurugashima (JP); Kiyoshi Shimomura, Tsurugashima (JP)

(73) Assignee: Pioneer Corporation, Tokyo (JP)

( * ) Notice: Subject to any disclaimer, the term of this patent is extended or adjusted under 35 U.S.C. 154(b) by 333 days.

(21) Appl. No.: 09/714,901

(22) Filed: Nov. 16, 2000

(30) Foreign Application Priority Data

Nov. 18, 1999 (JP) .......................................... 11-327581

(51) Int. Cl.[7] ................................................. H01S 3/04
(52) U.S. Cl. .......................................... 372/36; 372/34
(58) Field of Search ............................... 372/34, 36, 50, 372/109; 369/44.12

(56) References Cited

U.S. PATENT DOCUMENTS

| | | | |
|---|---|---|---|
| 4,567,598 A | * | 1/1986 | Noguchi et al. .............. 372/36 |
| 5,113,404 A | * | 5/1992 | Gaebe et al. .................. 372/36 |
| 5,233,580 A | | 8/1993 | Tanaka et al. ........... 369/44.12 |
| 5,590,144 A | * | 12/1996 | Kitamura et al. ............. 372/36 |
| 5,689,108 A | * | 11/1997 | Ohyama ..................... 250/239 |
| 5,727,009 A | | 3/1998 | Tajiri et al. ................... 372/43 |
| 5,748,658 A | * | 5/1998 | Nakanishi et al. ............ 372/43 |
| 6,394,158 B1 | * | 5/2002 | Momeni ................... 152/272.8 |

FOREIGN PATENT DOCUMENTS

| | | |
|---|---|---|
| EP | 0917263 | 5/1999 |
| WO | WO 98/37603 | 8/1998 |

* cited by examiner

*Primary Examiner*—David Porta
*Assistant Examiner*—Davienne Monbleau
(74) *Attorney, Agent, or Firm*—Perman & Green, LLP

(57) ABSTRACT

A holding member, which beforehand fixedly holds a semiconductor laser element and has thermal conductivity, is fixed to a base member, which is fixed to a case and which has thermal conductivity, by the use of a thermal type adhesive member having thermal conductivity so that the semiconductor laser element is disposed at a predetermined optical position where optical adjustment has been carried out with respect to an optical system of the case.

8 Claims, 8 Drawing Sheets

HEAT

SEMICONDUCTOR MODULE AND METHOD OF MOUNTING SEMICONDUCTOR LASER ELEMENT ON THE SAME

BACKGROUND OF THE INVENTION

1. Field of the Invention

This invention relates to a semiconductor module and a method of mounting a semiconductor laser element on the semiconductor module.

2. Description of the Related Art

As is well known, an optical pickup for reading information recorded on an optical disks, such as a CD and DVD, can optically read the information such that a laser beam emitted from a semiconductor laser element, which serves as a light source, disposed in a main body, is guided to an objective lens along an optical path of a predetermined optical system made up of various optical components. A light beam gathered by the objective lens is then projected onto the information recording surface of the optical disk, reflected light that has undergone light modulation according to the recorded information of the optical disk is then generated. The reflected light is then guided again through the objective lens to a light receiving element along a predetermined optical path, and, based on the output of received light, the light receiving element generates a signal according to the recorded information of the optical disk.

In an optical pickup such as this, in order to read recorded information of the optical disk accurately, it is required that a laser beam of a predetermined wavelength emitted from the semiconductor laser element be caused to, without being out of alignment with an optical axis, fall upon the predetermined optical system and generate a light beam by the light gathering of the objective lens, and the light beam be focused at an appropriate position on the information recording surface of the optical disk. To do so, the semiconductor laser element must be disposed so to have no axial deviation with respect to the optical system and take an appropriate position in the axial direction of the laser beam with respect to the predetermined optical system.

If the semiconductor laser element is not disposed properly with respect to the optical system, the laser beam is made incident in a deviated state of the optical axis of the laser beam with respect to the optical axis of the optical system. Accordingly, the incident position of the light beam on the information recording surface or the incident angle of the light beam deviates from an allowable range, so that reflected light does not undergo accurate light modulation by recorded information, and the incident position of the obtained reflected light on the light receiving element deviates greatly. As a result, it is impossible not only to obtain a sufficient amount of reflected light but also to allow the reflected light to undergo accurate light modulation according to recorded information. This often makes it impossible to accurately read the recorded information by means of the reflected light.

Therefore, in the optical pickup, some optical components, which are to be disposed beforehand at predetermined positions in the main body, are each fixed at a predetermined position in the main body properly, and the semiconductor laser element is mounted in the body so as to be positionally adjustable with respect to the optical system made up of the optical components, and, thereafter, the optical position of the semiconductor laser element is adjusted with respect to the optical system.

The semiconductor laser element is inserted into a holding hole formed in, for example, a heat radiation member made of a material that has heat radiating properties as if the laser element is dropped thereinto, and the heat radiation member is mounted in a main body in a state in which the laser element is held in the heat radiation member while being pressed by, for example, a leaf spring. By moving the semiconductor laser element with respect to the pressing leaf spring, positional adjustment can be made in a planar direction (x-y axis direction) perpendicular to an axial direction (z axis direction) of the laser beam emitted from the semiconductor laser element.

The heat radiation member for holding the semiconductor laser element is held in the main body, and is mounted to be movable and adjustable in the direction of the optical axis (z axis direction) of the laser beam emitted from the semiconductor laser element with respect to a case. The positional adjustment in the directions of the three axes (x axis, y axis and z axis) is repeatedly carried out for each axial direction by the use of an adjusting fixture, and, thereby, the positional adjustment of the semiconductor laser element with respect to the heat radiation member and the positional adjustment of the heat radiation member with respect to the case are carried out, and, as a result, the adjustment of the optical position of the semiconductor laser element is carried out.

In order to adjust the optical position of the semiconductor laser element of the conventional optical pickup, in addition to the adjusting method carried out by arranging the optical components as mentioned above, there is another adjusting method in which, for example, the semiconductor laser element is mounted to be movable and adjustable in the directions of two axes (x axis and y axis) with respect to the pickup body, and the light receiving element (PD) among the other optical systems is mounted to be movable and adjustable in the axial direction (z axis direction) of the laser beam. In this method, the positional adjustment of the laser beam in the directions of the three axes (x axis, y axis, and z axis) is carried out by repeatedly carrying out the axial adjustment (x-y adjustment) of the semiconductor laser element and the axial adjustment (z adjustment) of the light receiving element (PD).

As mentioned above, the adjustment of the optical position of the laser beam of the semiconductor laser element must be repeatedly carried out in the direction of each axis after the semiconductor laser element, the light receiving element, etc., are temporarily mounted in the case. Therefore, much time is consumed to complete the adjustment of the optical position thereof.

OBJECTS AND SUMMARY OF THE INVENTION

The present invention was made in consideration of the above problem, and it is an object of the present invention to provide a semiconductor module capable of mounting a semiconductor laser element promptly and reliably at a predetermined optical position with respect to an optical system formed in the case of a semiconductor module and provide a mounting method of the semiconductor laser element of the semiconductor module.

According to a first aspect of the present invention, a semiconductor module comprises a semiconductor laser element; a holding member for fixedly holding the semiconductor laser element, the holding member having thermal conductivity; a base member for fixedly holding the holding member, the base member having thermal conductivity; and a case for fixedly holding the base member; in which a laser beam emitted from the semiconductor laser element is guided to a predetermined optical system disposed in the case and is projected out of the semiconductor module, and by fixing the holding member that fixedly holds the semiconductor laser element to the base member by means of a thermal type adhesive member that has thermal conductivity, the semiconductor laser element is fixed at a predetermined optical position where optical adjustment with respect to the optical system has been carried out.

In the semiconductor module according to the first aspect of the present invention, the semiconductor laser element can be promptly and reliably mounted at the predetermined optical position where optical adjustment with respect to the optical system of the case has been carried out, and, after mounting the semiconductor laser element, there is no need to adjust the optical position of the laser beam of the semiconductor laser element.

Further, in the semiconductor module according to the first aspect of the present invention, since the semiconductor laser element, the holding member, the adhesive member, and the base member make up a thermal path that has thermal conductivity, the heat generated when the semiconductor laser element emits a laser beam can be promptly transmitted to the base member. Accordingly, heat does not accumulate in the semiconductor laser element, and the operation of the semiconductor laser element becomes stable. Therefore, the life of the semiconductor laser element is not shortened.

According to a second aspect of the present invention, a semiconductor module comprises a plurality of semiconductor laser elements; a plurality of holding members for fixedly holding the plurality of semiconductor laser elements individually, the plurality of holding members having thermal conductivity; a plurality of base members for fixedly holding the plurality of holding members individually, the plurality of base members having thermal conductivity; and a case for fixedly holding the plurality of base members; in which laser beams emitted from the plurality of semiconductor laser elements are guided to an optical system formed by optical components disposed in the case and is projected out of the semiconductor module, and, by fixing the plurality of holding members that fixedly hold the plurality of semiconductor laser elements, respectively, to the plurality of base members, respectively, by means of a thermal type adhesive member that has thermal conductivity, the plurality of semiconductor laser elements are fixed at predetermined optical positions where optical adjustment with respect to the optical system has been carried out.

In the semiconductor module according to the second aspect of the present invention, the plurality of semiconductor laser elements can be promptly and reliably mounted at the predetermined optical positions where optical adjustment with respect to the optical system of the case has been carried out, and, after mounting the semiconductor laser elements, there is no need to adjust the optical positions of the laser beams of the semiconductor laser elements.

Further, in the semiconductor module according to the second aspect of the present invention, since the semiconductor laser elements, the holding members, the adhesive members, and the base members make up a thermal path that has thermal conductivity for each semiconductor laser element, the heat generated when the semiconductor laser elements emit laser beams can be promptly transmitted to the base member belonging to each thermal path. Accordingly, heat does not accumulate in each semiconductor laser element, and the operation of each semiconductor laser element becomes stable. Therefore, the life of each semiconductor laser element is not shortened.

According to a third aspect of the present invention, in the semiconductor module according to the first or second aspect of the present invention, the base member is fixedly held by the case in a state in which at least a part of the base member is exposed to the outside of the case.

According to the third aspect of the present invention, the heat generated when the semiconductor laser element emits a laser beam is transmitted to the base member belonging to the related thermal path, and, thereafter, the heat is efficiently radiated from the bare part of the base member outwardly. Accordingly, heat does not accumulate in the semiconductor laser element, and the operation of the semiconductor laser element becomes stable. Therefore, the life of the semiconductor laser element is not shortened.

According to a fourth aspect of the present invention, in the semiconductor module according to the third aspect of the present invention, the base member is greater in thermal conductivity than the case.

According to the fourth aspect of the present invention, the heat generated when the semiconductor laser element emits a laser beam is transmitted to the base member belonging to the related thermal path, and, thereafter, the heat is efficiently radiated from the bare part of the base member outwardly without diffusion into the case. Accordingly, heat does not accumulate in the semiconductor laser element, and the operation of the semiconductor laser element becomes stable. Therefore, the life of the semiconductor laser element is not shortened.

According to a fifth aspect of the present invention, in a mounting method of a semiconductor laser element of a semiconductor module for mounting the semiconductor laser element at an optical position where predetermined optical adjustment has been carried out with respect to an optical system formed by optical components disposed in a case of the semiconductor module, the mounting method comprises a first step of positioning the semiconductor laser element fixedly held by a holding member that has thermal conductivity at the optical position where the predetermined optical adjustment has been carried out with respect to the optical system formed by the optical components disposed in the case of the semiconductor module; a second step of heating a base member that is fixedly held by the case and has thermal conductivity; and a third step of fixing the holding member that fixedly holds the semiconductor laser element to the heated base member by means of a thermal type adhesive member that has thermal conductivity; in which, by fixing the base member to the heated base member in a state in which the semiconductor laser element held by the holding member is disposed at the optical position determined by the positioning in the third step, an optical axis of the semiconductor laser element is adjusted and the holding member is fixedly mounted at the predetermined optical position of the case with respect to the optical system.

According to the fifth aspect of the present invention, the semiconductor laser element can be promptly and reliably mounted at the predetermined optical position where optical adjustment with respect to the optical system of the case has been carried out, and, after mounting the semiconductor laser element, there is no need to adjust the optical position of the laser beam of the semiconductor laser element.

According to a sixth aspect of the present invention, in a method of mounting semiconductor laser elements of a semiconductor module for mounting the plurality of semiconductor laser elements at optical positions where predetermined optical adjustment has been carried out with respect to an optical system formed by optical components disposed in a case of, the semiconductor module, the mounting method comprises a first step of positioning one of the plurality of semiconductor laser elements fixedly held by a holding member that has thermal conductivity at one of the optical positions where the predetermined optical adjustment has been carried out with respect to the optical system formed by the optical components disposed in the case of the semiconductor module; a second step of heating a base member that is fixedly held by the case and has thermal conductivity; and a third step of fixing the holding member that fixedly holds the one of the plurality of semiconductor laser elements to the heated base member by means of a thermal type adhesive member that has thermal conductivity; in which, by fixing the holding member to the heated base mender in a state in which the one of the plurality of semiconductor laser elements held by the holding member is disposed at the one of the optical positions determined by the positioning in the third step, an optical axis of one of the plurality of semiconductor laser elements is adjusted and the holding member is fixedly mounted at the predetermined optical position of the case with respect to the optical system, and by sequentially and repeatedly performing the first, second, and third steps for the plurality of semiconductor laser elements, the plurality of semiconductor laser elements are mounted at optical positions, respectively, where predetermined optical adjustment has been carried out.

According to the sixth aspect of the present invention, the semiconductor laser elements can be promptly and reliably mounted at the predetermined optical positions where optical adjustment with respect to the optical system of the case has been carried out, and, after mounting the semiconductor laser elements, there is no need to adjust the optical positions of the laser beams of the semiconductor laser elements.

According to a seventh aspect of the present invention, in the mounting method according to the fifth or sixth aspect of the present invention, the base member is fixed to the case in a state in which at least a part of the base member is exposed to the outside of the case, and the heating of the base member in the second step is carried out such that the bare part of the base member is heated from the outside.

According to the seventh aspect of the present invention, the thermal type adhesive member placed on the base member that has thermal conductivity can be promptly and reliably heated by heating the bare part of the base member that has thermal conductivity, and, therefore, the holding member can be promptly and reliably fixed to the base member.

According to an eighth aspect of the present invention, the base member having a thermal conductivity is greater than that of the case is used in the third step of the mounting method according to the seventh aspect of the present invention.

According to the eighth aspect of the present invention, since the heat of the base member does not diffuse into the case when the bare part of the base member having a thermal conductivity is greater than that of the case is heated, the thermal type adhesive member placed on the base member that has thermal conductivity can be promptly and reliably heated, and, therefore, the holding member can be promptly and reliably fixed to the base member.

DETAILED DESCRIPTION OF THE PREFERRED EMBODIMENTS

Preferred embodiments of the present invention will be described hereinafter with reference to the attached drawings.

Figure 1:
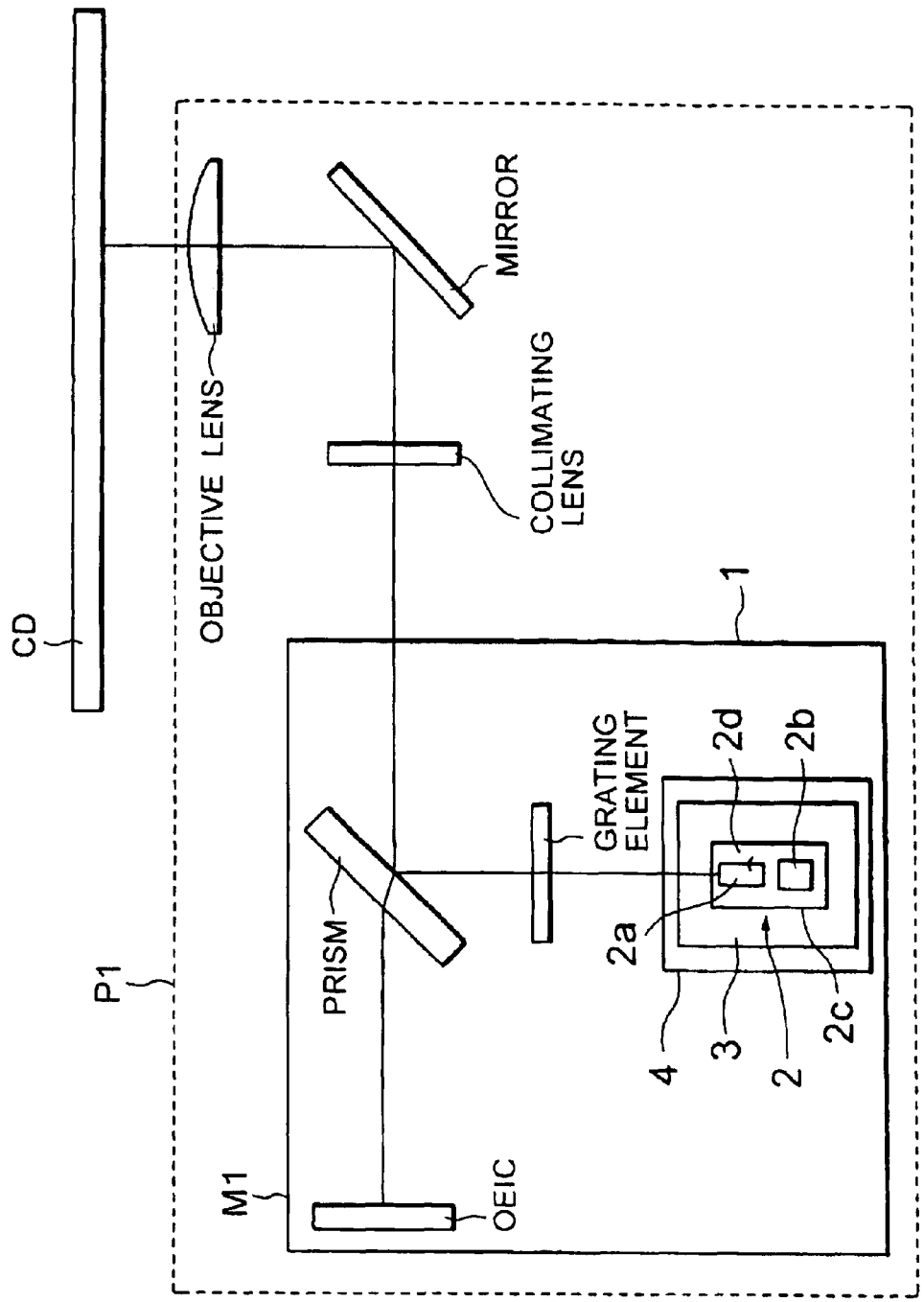
FIG. 1 is a schematic view of an optical path of an optical pickup P1 that uses a semiconductor module M1 according to a first embodiment of the present invention.

FIG. 1 is a schematic view of an optical path of an optical pickup P1 that uses a semiconductor module M1 according to a first embodiment of the present invention. The optical pickup P1 is a pickup capable of reading information recorded onto a CD, and optical components that comprise the semiconductor module M1, a collimating lens, a mirror, and an objective lens are disposed at predetermined optical positions of a main body.

As shown in FIG. 1, the semiconductor module M1 includes a semiconductor laser element 2 that emits a laser beam having a wavelength is 780 nm for reading the CD, a grating element, a prism, and an IC (OEIC) for photoelectric conversion that serves as a light receiving element, each disposed at predetermined optical positions in a case 1 of the semiconductor module M1. The semiconductor module M1 is disposed at a predetermined optical position of the optical pickup P1, thereby making up a part of the optical system of the optical pickup P1.

As shown in FIG. 1, in the optical pickup P1 that uses the semiconductor module M1, a laser beam emitted from the semiconductor laser element 2 passes through the grating element, is then reflected by the prism, then passes through the collimating lens, is then reflected by the mirror, then passes through the objective lens, and strikes the information recording surface of the optical disk. The laser beam reflected by the optical disk travels along the same optical path through the prism, and is input to the OEIC.

The semiconductor laser element 2 is fixed to a spacer 3 by means of a bonding member (solder, in this embodiment) that has thermal conductivity. The spacer 3 is fixed to a substrate 4 serving as a base member that is fixed at a predetermined position of the case 1 of the semiconductor module M1, and thereby the spacer 3 is disposed at a predetermined optical position with respect to other optical components of the semiconductor module M1.

Figure 2:
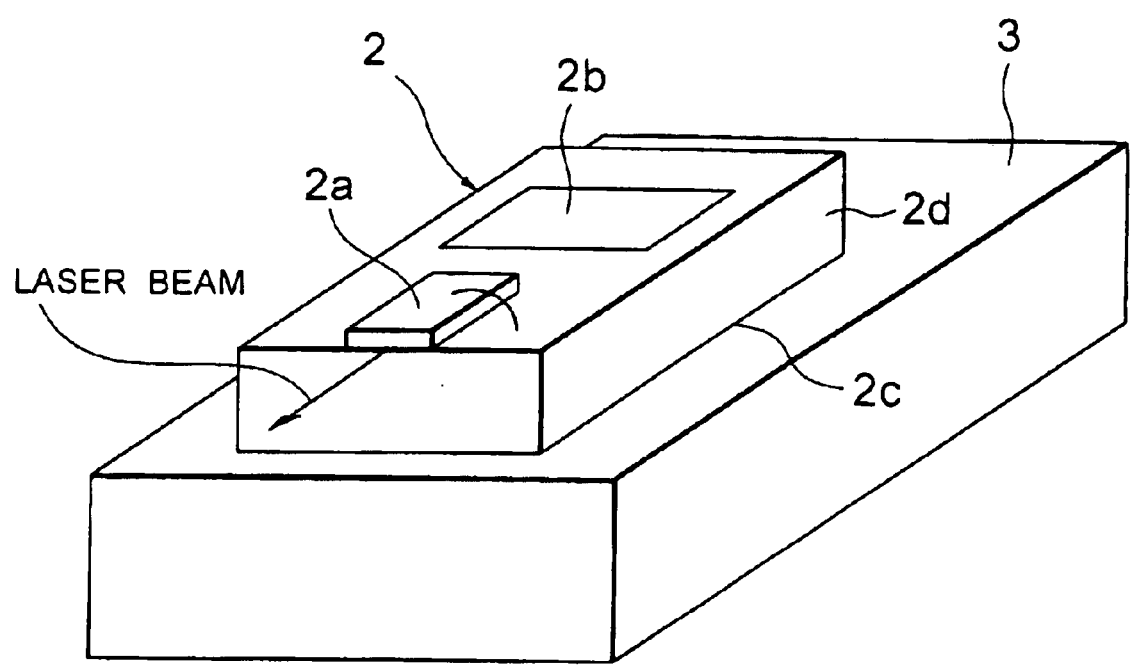
FIG. 2 shows a semiconductor laser element that is fixedly held by a spacer.

FIG. 2 shows the semiconductor laser element 2 fixed to the spacer 3. The semiconductor laser element 2 is made up of a laser chip 2a, a positive electrode 2b, a negative electrode 2c, and a submount 2d. The submount 2d is fixed onto the spacer 3. The laser chip 2a is fixed onto the submount 2d. The positive electrode 2b is mounted on the side of the surface of the submount 2d, i.e., on the side of the surface on which the laser chip 2a is fixed. The negative electrode 2c is disposed on the backside of the submount 2d. The side of the negative electrode 2c is fixed to the spacer 3. The electrodes are connected to an electric circuit (not shown) mounted in the case 1, and, by the electric input supplied by the electric circuit, the semiconductor laser element 2 emits a laser beam onto the grating element in the case 1.

The spacer 3 is a holding member for moving the semiconductor laser element 2 while properly holding it when an assembly control device of the semiconductor module disposes the semiconductor laser element 2 at a predetermined optical position of the case 1 by a method, which is described below. The spacer 3 is made of a material that has thermal conductivity, such as copper or aluminum nitride.

The spacer 3 is required to quickly transmit heat generated in the body of the semiconductor laser element 2 to the substrate 4 when the semiconductor laser element 2 emits a laser beam. Preferably, the spacer 3 is formed with a material having a thermal expansion coefficient is small in order that the optical axis of the laser beam emitted from the semiconductor laser element 2 does not deviate.

Therefore, in this embodiment, the spacer 3 is formed with copper that is conductive and is compatible for use with solder. The upper surface side of the spacer 3 is soldered with the negative electrode 2c of the semiconductor laser element 2 so as to closely and fixedly connect the semiconductor laser element 2, and is electrically connected to the negative electrode 2c of the semiconductor laser element 2. In addition, the undersurface side of the spacer 3 is fixed to the substrate 4 serving as a base member with a thermal type bonding member that has thermal conductivity. In this embodiment, solder is used as the bonding member.

The substrate 4 is a material that has thermal conductivity, and is formed with a material capable of fixing the spacer 3 by means of a thermal type bonding member (solder, in this embodiment). Specifically, the substrate 4 is formed with a copper plate having a thickness is about 0.4 mm in this embodiment so that the heat of the semiconductor laser element 2 conducted from the spacer 3 can be efficiently radiated to the outside of the case 1.

The case 1 is formed with a material having a thermal conductivity is lower than the substrate 4. Herein, by performing insert molding of the substrate 4 by the use of molding resin, the case 1 is formed integrally with the substrate 4 so as to fixedly hold the substrate 4. Additionally, the case 1 is formed so as to allow at least a part of the substrate 4 to be exposed to the outside of the case 1. In this embodiment, a part of the back side of the surface of the substrate 4 where the spacer 3 is fixed with solder is exposed to the outside of the case 1.

Therefore, since a thermal path having thermal conductivity is established with the semiconductor laser element 2, the spacer 3, the solder joining the spacer 3 to the substrate 4, and the substrate 4, it is possible to swiftly conduct the generated heat when the semiconductor laser element 2 emits a laser beam to the substrate 4 and radiate it from the part of the substrate 4 exposed to the outside of the case 1.

In the semiconductor module M1 of this embodiment, the semiconductor laser element 2 is mounted at a predetermined optical position in the case 1 by soldering the spacer 3 that beforehand fixedly holds the semiconductor laser element 2 with the substrate 4 fixed to the case 1.

When the spacer 3 is soldered with the substrate 4, the spacer 3 is fixed to the substrate 4 in a state in which the semiconductor laser element 2 has no deviation from the optical axis of the laser beam with respect to optical systems formed by other optical components mounted in the case 1 and is disposed at a predetermined optical position that is proper for the axial direction of the laser beam. As a result, the semiconductor laser element 2 is mounted in the case 1 in a state in which the axial adjustment of the laser beam or the positional adjustment of the axial direction thereof has been made with respect to the optical systems formed by the other optical components mounted in the semiconductor module M1.

Next, a description will be given of a method of mounting the semiconductor laser element 2 at a predetermined optical position in the case 1 of the semiconductor module M1 with reference to FIG. 3A to FIG. 3C.

The semiconductor laser element 2 is mounted in the case 1 by using the assembly control device of the semiconductor module. The assembly control device has a stage for disposing and fixing the case 1 at a predetermined position and arms 5 for detachably holding the spacer 3, to which the semiconductor laser element 2 is fixed. The assembly control device can memorize a spatial coordinate (x, y, z) where the arms 5 holding the spacer 3 are situated according to instructions and can move to each position in the three axial directions of (x, y, z). In the assembly control device, the collimating lens, the mirror, the objective lens, and the CD shown in FIG. 1 are fixedly disposed at their predetermined positions so that the optical path of the same optical system as the optical pickup P1 shown in FIG. 1 is formed when the case 1 of the completed semiconductor module M1 is disposed at the predetermined position of the stage.

Figure 3A:
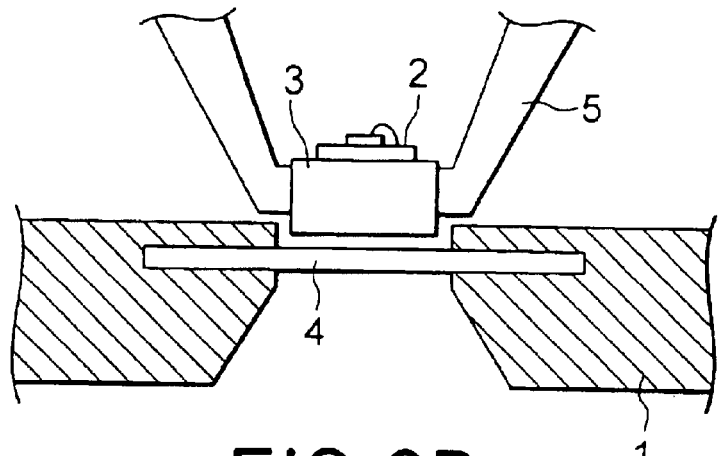
FIGS. 3A to 3C show sequential steps of a method in which the semiconductor laser element is mounted at a predetermined optical position in a case of the semiconductor module M1 by the use of an assembly control device.
Figure 3B:
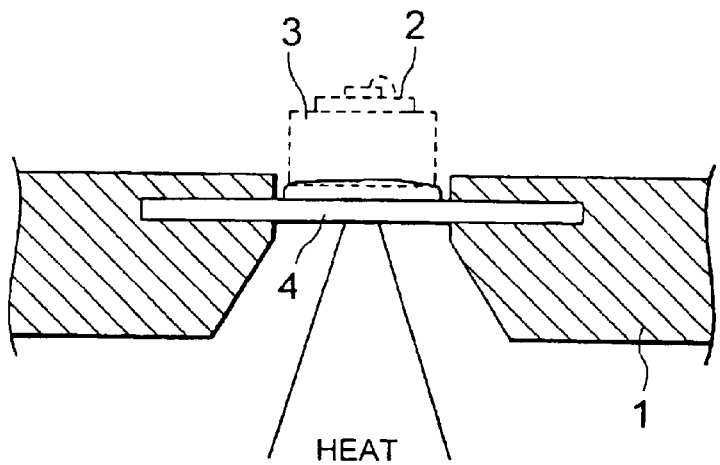
Figure 3C:
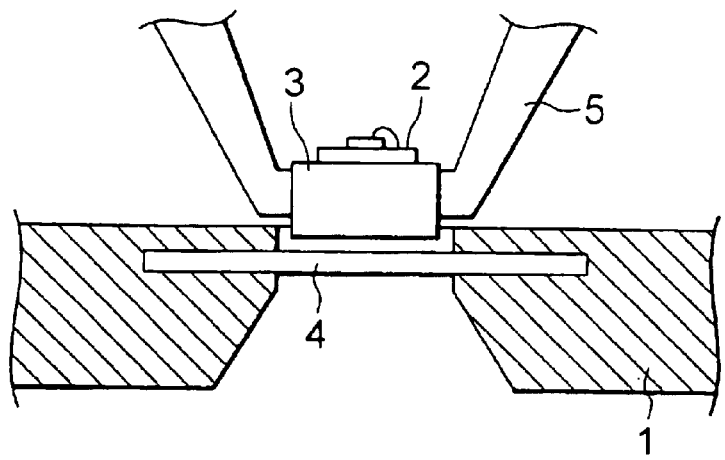

FIGS. 3A to 3C show the sequential steps (in order of FIGS. 3A to 3C) of the method of mounting the semiconductor laser element 2 at a predetermined optical position in the case 1 of the semiconductor module M1 by using the assembly control device.

First, as a pre-step, the back side of the semiconductor laser element 2 (i.e., negative electrode 2c side) is beforehand fixed to the spacer 3 with a bonding material that has thermal conductivity, prior to the steps of FIG. 3A (see FIG. 2). In this embodiment, the negative electrode 2c side of the semiconductor laser element 2 is fixed and electrically connected to the spacer 3. Therefore, since it is desirable for the bonding material to have conductivity, solder is used herein.

The other optical components, such as the grating element, the prism, the OEIC, shown in FIG. 1 that are constituent elements of the semiconductor module M1 are mounted at predetermined optical positions in the case 1 in which the substrate 4 has undergone the insert molding.

Thereafter, the case 1 in which the optical components are mounted is fixed on the stage of the assembly control device of the semiconductor module, and then the spacer 3 to which the semiconductor laser element 2 is fixed is held by the arms 5 of the assembly control device.

The arms 5, which are made of a conductive material herein, hold the spacer 3 and, thereby, become conductive with the spacer 3. Since the spacer 3 is electrically connected to the negative electrode 2c of the semiconductor laser element 2 fixed by the spacer 3 as mentioned above, the arms 5 become conductive with the negative electrode 2c of the semiconductor laser element 2 when the arms 5 hold the spacer 3. Additionally, when the arms 5 hold the spacer 3, a contact finger (not shown) of the assembly control device is electrically connected to the positive electrode 2b of the semiconductor laser element 2.

Thereafter, the assembly control device spatially and properly moves the arms 5, and thereby, as shown in FIG. 3A, the spacer 3 to which the semiconductor laser element 2 is fixed is moved directly over the substrate 4, which is fixed to the case 1 and on which the spacer 3 is to be mounted. Thereafter, the electrical input is supplied to the semiconductor laser element 2 through the arms 5 and the contact finger that are electrically connected to the respective electrodes of the semiconductor laser element 2, and a laser beam is emitted from the semiconductor laser element 2 to the grating element.

Thereafter, the arms 5 are spatially and properly moved while holding the spacer 3, and the position of the semiconductor laser element 2 is adjusted to allow the laser beam from the semiconductor laser element 2 to appropriately strike the predetermined optical system formed by the other optical components in the case 1.

This positioning is carried out based on the output of the received light of the OEIC obtained when the laser beam emitted from the semiconductor laser element 2 is caused to strike the optical system formed by the optical components in the case 1 and the collimating lens, the mirror, the objective lens, etc., disposed at the predetermined positions of the assembly control device and is received by the OEIC in the case 1.

Accordingly, the semiconductor laser element 2 fixed to the spacer 3 is disposed at a predetermined optical position that has no deviation of the optical axis with respect to the aforementioned predetermined optical system and is proper for the travelling direction of the laser beam. FIG. 3A shows this state. As a result, the spacer 3 is disposed slightly apart from the substrate 4.

Thereafter, the position of the arms 5 when the semiconductor laser element 2 is disposed at the predetermined optical position is calculated from the present spatial coordinate (x, y, z) and stores the result in a storage portion of the assembly control device. Thus, the positioning of the semiconductor laser element 2 is performed. Thereafter, the arms 5 holding the spacer 3 are temporarily lifted to move the spacer 3 away from the substrate 4, and the spacer 3 is continuously held by the arms 5.

Thereafter, a predetermined amount of solder is placed on the substrate 4, and, as shown in FIG. 3B, a part of the substrate 4 that is exposed to the outside of the case 1 is locally heated with, for example, a condensed beam by the use of a xenon lamp so as to melt the solder on the substrate 4 quickly. As a result, the substrate 4 is soldered preliminarily.

Herein, since the substrate 4 made of copper is greater in thermal conductivity than the case 1 made of molding resin and is about 0.4 mm thick, the part of the substrate 4 that is exposed to the outside of the case 1 is quickly heated. Additionally, since the case 1 is made of a material having a thermal conductivity is lower than the substrate 4, the heat applied to the substrate 4 by the condensed beam does not diffuse into the case 1, and, therefore, is efficiently transmitted to the solder placed on the substrate 4. As a result, the solder on the substrate 4 can be melted promptly and infallibly.

The dotted line in FIG. 3B indicates the spatial position of the semiconductor laser element 2 that has undergone the positioning at the predetermined optical position in FIG. 3A and the spatial position of the spacer 3 that fixes the semiconductor laser element 2.

Thereafter, the arms 5 are moved to the spatial coordinate (x, y, z) that has been stored in the storage portion as shown in FIG. 3C, and the spacer 3 is joined to the substrate 4 with melting solder in a state in which the semiconductor laser element 2 fixed to the spacer 3 that the arms 5 are holding is disposed at a predetermined optical position. Thereafter, heating by the condensed beam is stopped to cool the solder, thereby fixing the spacer 3 to the substrate 4. In this situation, the arms 5 hold the spacer 3 at the predetermined position at least until the spacer 3 is completely fixed to the substrate 4.

It is noted that the solder placed on the substrate 4 is required in an amount large enough to close up a gap between the spacer 3 that fixes the semiconductor laser element 2 disposed at the predetermined optical position and the substrate 4.

The solder that has, melted by heating is pushed to the periphery of the spacer 3 by the substrate 4. However, as shown in FIG. 3C, the flow of the solder is blocked by the sidewall of the hole of the case 1 without careless extension when soldering. Therefore, the spacer 3 is reliably soldered with the substrate 4.

According to the aforementioned method, the semiconductor laser element 2 can be mounted promptly and reliably at the predetermined optical position where the adjustment of the optical axis of the laser beam or the positional adjustment of the direction of the optical axis has been conducted with respect to the optical system formed by the other optical components disposed in the case 1 of the semiconductor module M1.

In the first embodiment mentioned above, the case 1 uses molding resin having a thermal conductivity is lower than the substrate 4, and is formed integrally with the substrate 4 by the insert molding of the substrate 4 so as to fix the substrate 4. However, instead, a substrate 6 may be fixed to a case 7 that has a hole communicating with the outside, as shown in FIG. 4 in which another example of the case is illustrated.

Figure 4:
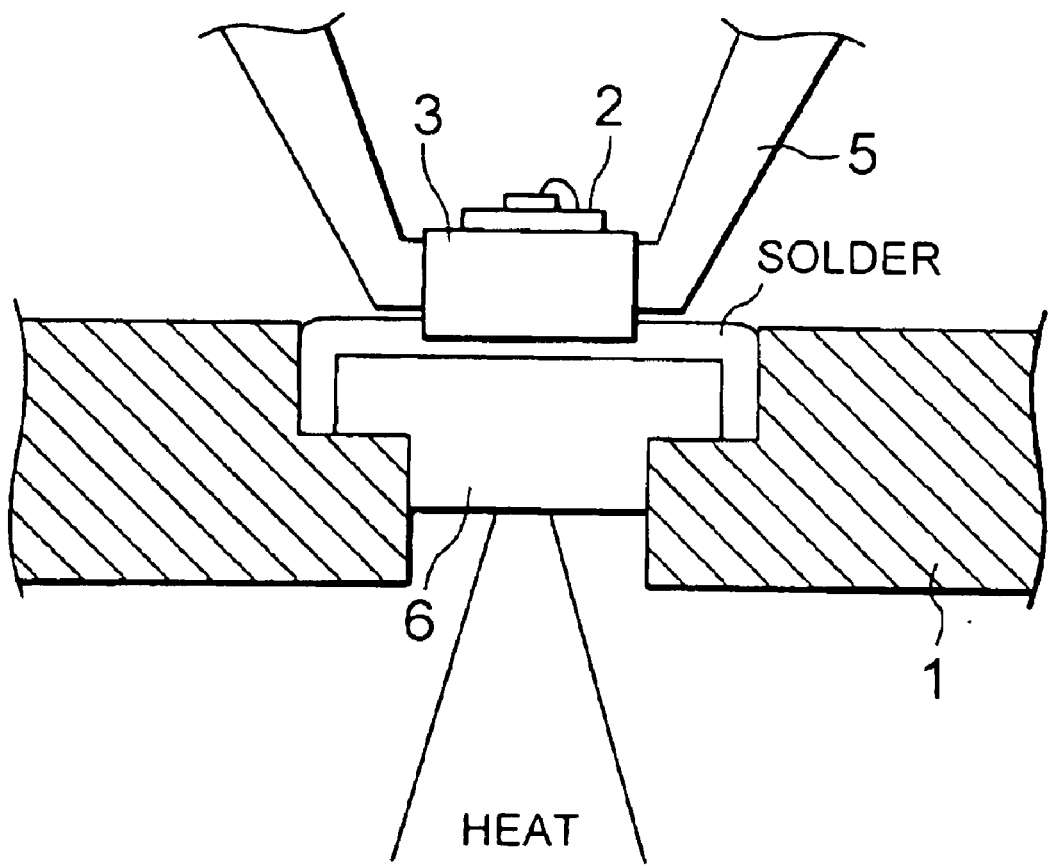
FIG. 4 shows another example of the case in the present invention.

FIG. 4 shows another example of the case in the present invention. In FIG. 4, the substrate 6 is made of copper as the aforementioned substrate 4. In this example, the case 7 is made of a material that is much inferior in thermal conductivity to the copper substrate 6, i.e., it is made of ceramic having a thermal conductivity is extremely low. The substrate 6 is fixed to the case 7 by silver soldering to a mounting hole formed in the case 7, and a part of the substrate 6 is exposed from the hole to the outside of the case 7. The case 7 is formed by coating the surface of the ceramic with alumina so as to allow the substrate 6 to be subjected to silver soldering.

The method of joining the spacer 3 to the substrate 6 fixed by the case 7 with solder is the same as the method of joining the spacer 3 to the substrate 4 fixed by the aforementioned case 1 with solder, and a description of the details thereof is omitted to prevent the repetition.

In the embodiment mentioned above, a description was given of an example in which one semiconductor laser element 2 is mounted at the predetermined optical position in the case of the semiconductor module. However, the present invention is not limited to this. Even in a semiconductor module that has a plurality of light sources (semiconductor lasers), it is possible to mount each semiconductor laser promptly and reliably according to the same method. Such an example will be described hereinafter according to a second embodiment of the present invention.

Figure 5:
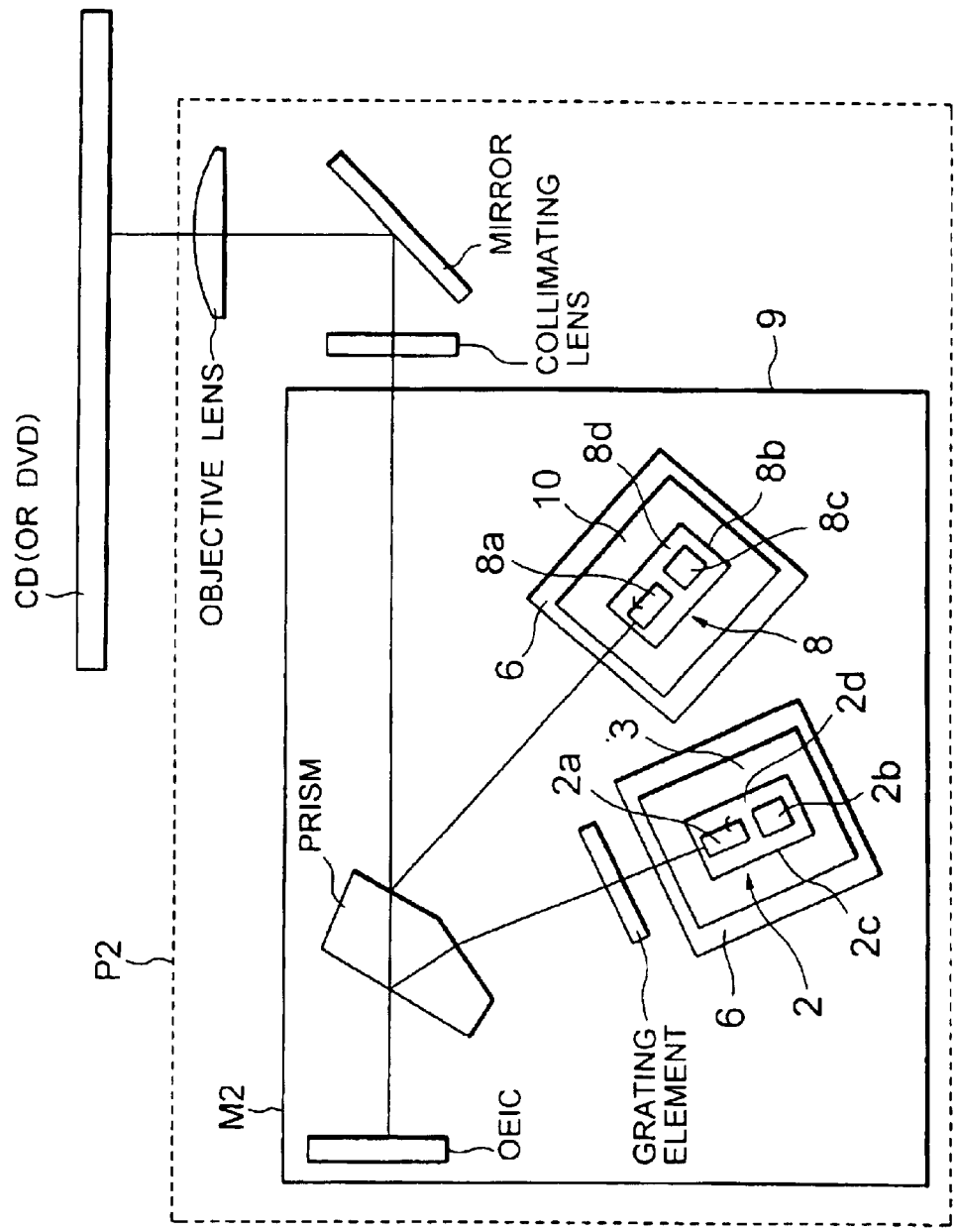
FIG. 5 is a schematic view of an optical path of an optical pickup P2 that uses a semiconductor module M2 according to a second embodiment of the present invention.

FIG. 5 is a schematic view of an optical path of an optical pickup P2 that uses a semiconductor module M2 in the second embodiment of the present invention. The optical pickup P2 is a two-light-source pickup capable of reading information recorded onto a CD and a DVD while switching therebetween, and includes a semiconductor laser element 2 that emits a laser beam having a wavelength is 780 nm to read the CD and a semiconductor laser element 8 that emits a laser beam having a wavelength is 650 nm to read the DVD. As shown in FIG. 5, the semiconductor module M2 includes the semiconductor laser element 2, the semiconductor laser element 8, a grating element, a prism, and an IC (OEIC) for photoelectric exchange that serves as a light receiving element, each disposed at a predetermined optical position in a case 9 of the semiconductor module M2.

In the optical pickup P2, in order to read the recorded information of the CD, the laser beam emitted from the semiconductor laser element 2 passes through the grating element, then passes through the principal surface of the prism, is then reflected by the back of the prism, then passes through the principal surface of the prism again, then travels to the mirror through a collimating lens, and is projected onto the information recording surface of the CD through an objective lens. The laser beam reflected from the CD travels along the same path, then passes through the prism, and is input to the OEIC.

On the other hand, in the optical pickup P2, in order to read the recorded information of the DVD, the laser beam emitted from the semiconductor laser element 8 is first reflected by the principal surface of the prism, then travels to the mirror through the collimating lens, and is projected onto the information recording surface of the DVD through the objective lens. The laser beam reflected from the DVD travels along the same path, then passes through the prism, and is input to the OEIC.

As in the aforementioned semiconductor module M1, the semiconductor, laser element 2 is fixed to the spacer 3 by means of a bonding member that has thermal conductivity. On the other hand, the semiconductor laser element 8 is fixed to a spacer 10, which serves as a holding member having thermal conductivity, by means of a bonding member that has thermal conductivity. As in the first embodiment, solder is used as the bonding member. The semiconductor laser element 2 and the semiconductor laser element 8 are fixed by joining each spacer holding the laser elements 2 and 8 at predetermined positions of a case 9 of the semiconductor module M2 to each of two substrates 6 that serve as base members with solder that is a thermal type bonding member and has independent thermal conductivity for each spacer. Accordingly, the semiconductor laser elements 2 and 8 are disposed at predetermined optical positions with respect to the other optical components of the semiconductor module M2.

A positive electrode 2b and a negative electrode 2c are connected to an electric circuit (not shown) disposed in the case 9, and the semiconductor laser element 2 emits a laser beam to the grating element in the case 9 according to the electric input supplied from the electric circuit.

Figure 6:
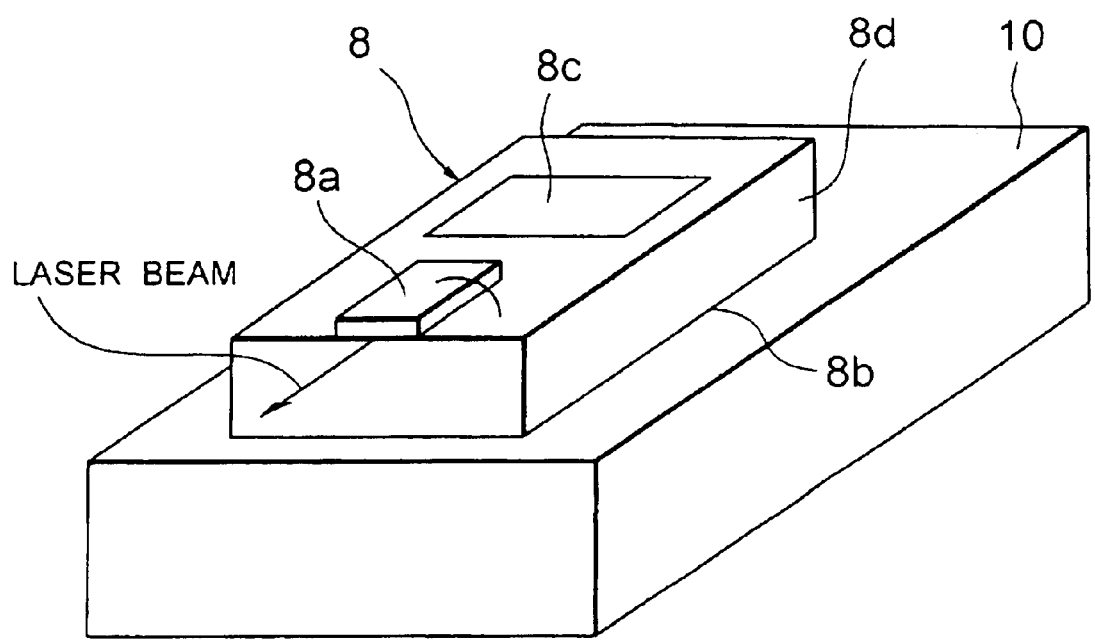
FIG. 6 shows the semiconductor laser element that is fixedly held by the spacer.

FIG. 6 shows the semiconductor laser element 8 fixed to the spacer 10. The semiconductor laser element 8 is made up of a laser chip 8a, a positive electrode 8b, a negative electrode 8c, and a submount 8d. The submount 8d is fixed on the spacer 10. The laser chip 8a is fixed on the submount 8d. The negative electrode 8c is disposed on the top surface side of the submount 8d, i.e., on the side of the surface on which the laser chip 8a is fixed, and the positive electrode 8b is disposed on the back side of the submount 8d. The side of the positive electrode 8b is soldered and fixed to the spacer 10 serving as a holding member. Herein, the spacer 10 is made of aluminum nitride that has thermal conductivity.

The positive electrode 8b and the negative electrode 8c are connected to an electric circuit (not shown) disposed in the case 9, and the semiconductor laser element 8 emits a laser beam to the grating element in the case 9 according to the electric input supplied from the electric circuit.

Like the case 7, the case 9 is made of a ceramic that is greatly inferior in thermal conductivity compared to the copper substrate 6. The two substrates 6 are subjected to silver soldering to two mounting holes formed at two predetermined positions in the case 9, respectively, and are fixed to the case 9. Additionally, a part of each substrate 6 is exposed from each mounting hole to the outside of the case 7. Like the case 7, the case 9 is formed by coating the surface of the ceramic with alumina so as to allow the substrate 6 to be subjected to silver soldering.

Now, a description will be given of a method of mounting the semiconductor laser elements 2 and 8 at predetermined optical positions in the case 9 of the semiconductor module M2 with reference to FIG. 7 and FIG. 8. In this embodiment, the semiconductor laser element 2 is first mounted on one of the two substrates 6 that the case 9 holds, and then the semiconductor laser element 8 is mounted on the other substrate 6. In this method, the assembly control device of the semiconductor module is used as in the example in which the semiconductor laser element 2 is mounted in the case 1 in the first embodiment.

Figure 7A:
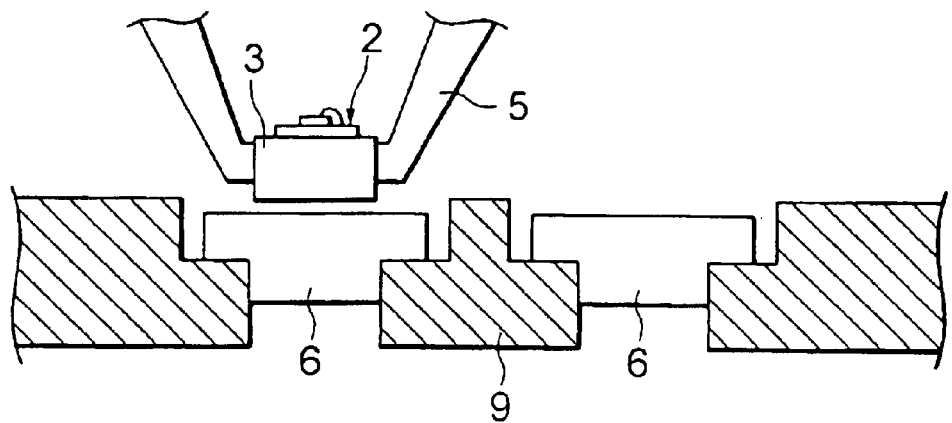
FIGS. 7A to 7C show sequential steps of a method in which a semiconductor laser element and another semiconductor laser element are mounted at predetermined optical positions in a case of the semiconductor module M2 by the use of an assembly control device.
Figure 7B:
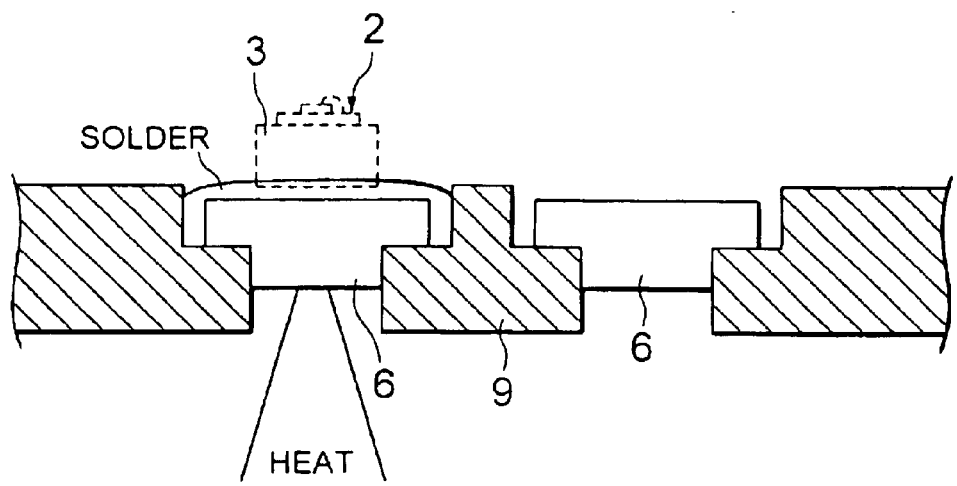
Figure 7C:
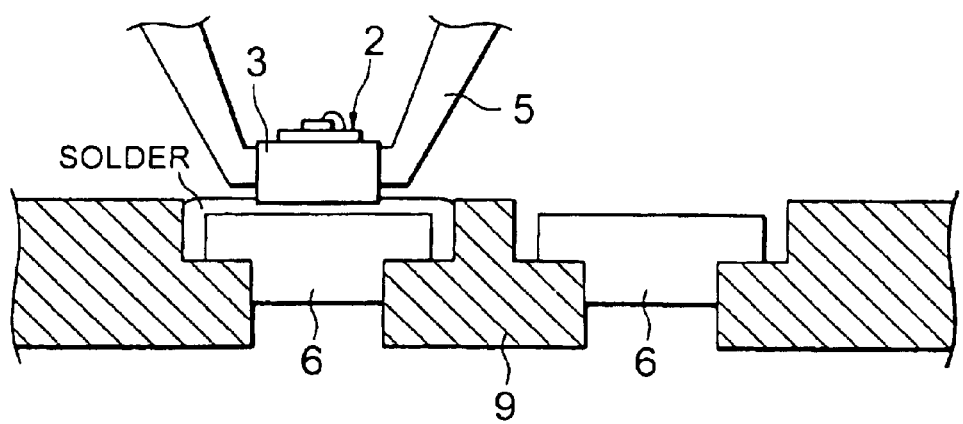
Figure 8A:
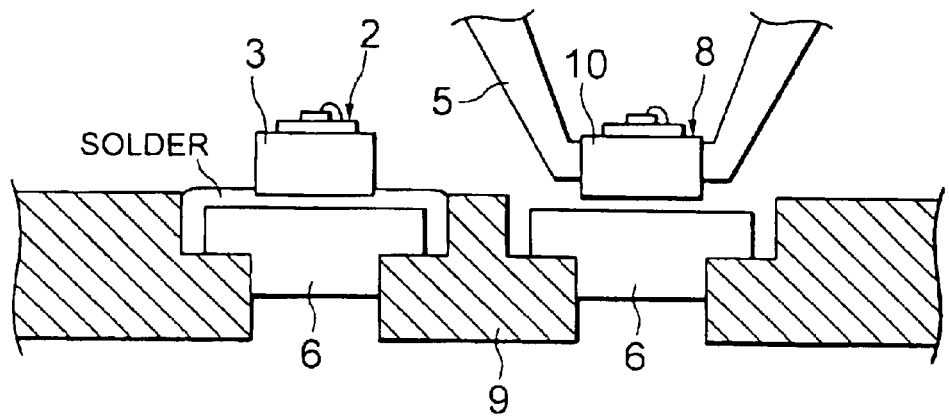
FIGS. 8A to 8C show sequential steps (subsequent to the step of FIG. 7C) of a method in which a semiconductor laser element and another semiconductor laser element are mounted at predetermined optical positions in a case of the semiconductor module M2 by the use of an assembly control device.
Figure 8B:
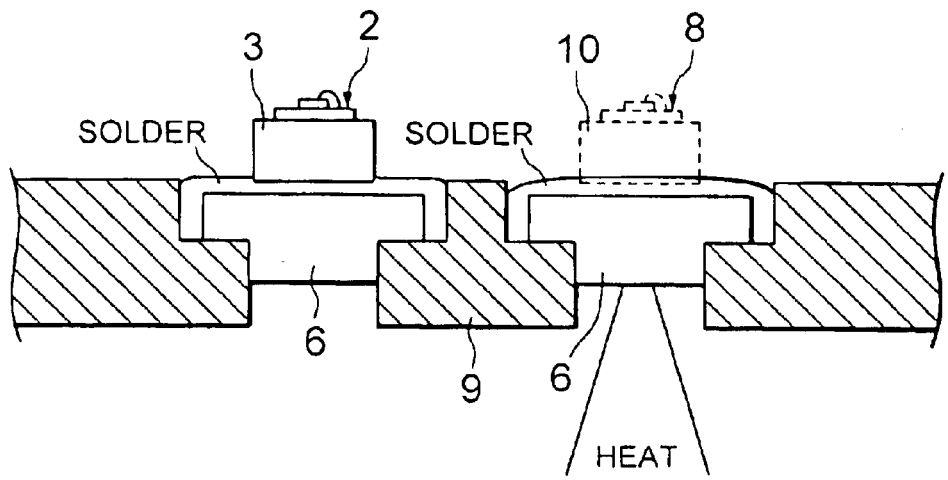
Figure 8C:
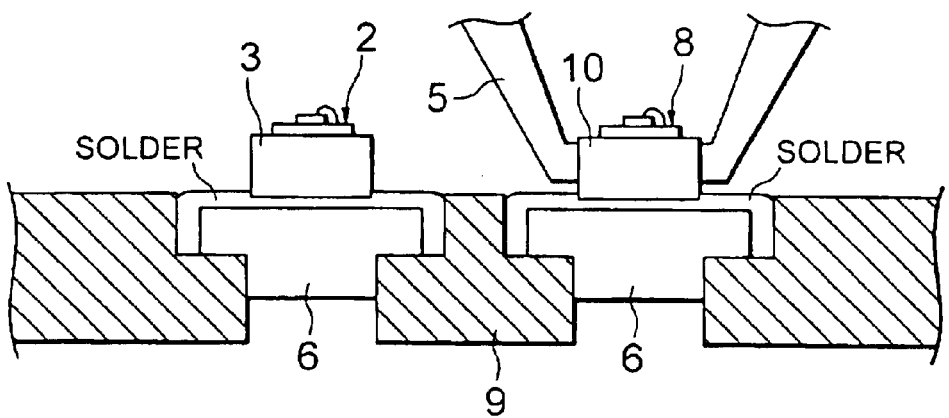

FIG. 7A to FIG. 8C show the sequential steps of the method of mounting the semiconductor laser elements 2 and 8 at predetermined optical positions in the case 9 of the semiconductor module M2 by using the assembly control device. The steps proceed in order of FIG. 7A to FIG. 7C, and the steps subsequent to the step of FIG. 7C are shown in FIG. 8A to FIG. 8C in this order.

Prior to the steps of FIG. 7A to FIG. 8C, as a pre-step, the back side of the semiconductor laser element 2 (i.e., side of the negative electrode 2c) is first fixed to the spacer 3 by means of an adhesive material that has thermal conductivity, and the back side of the semiconductor laser element 8 (i.e., side of the positive electrode 8b) is fixed to the spacer 10. In this embodiment, the negative electrode side (2c) of the semiconductor laser element 2 and the positive electrode side (8b) of the semiconductor laser element 8 are fixed to be electrically connected to the spacer 3 and the spacer 10, respectively. Therefore, since it is desirable for the adhesive material to have conductivity, solder is used herein.

The other optical components, such as the grating element, the prism, and the OEIC, which are the constituent components of the semiconductor module M2 shown in FIG. 5, are disposed at predetermined optical positions in the case 9 in which the two substrates 6 are each fixed at a predetermined position in the case 9.

Thereafter, the case 9 in which the optical components are mounted is fixed on the stage of the assembly control device of the semiconductor module, and then the spacer 3 to which the semiconductor laser element 2 is fixed is held by the arms 5.

Thereafter, as in the step of FIG. 3A, the assembly control device spatially and properly moves the arms 5 so as to move the spacer 3 that fixes the semiconductor laser element 2 to above the substrate 6 on which the spacer 3 is mounted. Thereafter, electrical input is supplied to the semiconductor laser element 2 through the arms 5 and the contact finger that are electrically connected to the semiconductor laser element 2, and a laser beam is emitted from the semiconductor laser element 2. In this example, the arm 5 is connected to the negative electrode side (2c) of the semiconductor laser element 2, and the contact finger is connected to the positive electrode side (2b) of the semiconductor laser element 2.

Next, positioning is performed so that a laser beam emitted from the semiconductor laser element 2 properly falls upon the predetermined optical system formed by the other optical components in the case 9 while spatially and properly moving the arms 5 holding the spacer 3. Thereby, the semiconductor laser element 2 fixed to the spacer 3 is disposed at a predetermined optical position where the semiconductor laser element 2 has no deviation of optical axis with respect to the predetermined optical system mentioned above and the element 2, is proper for the travelling direction of the laser beam. FIG. 7A shows this state. The spacer 3 is disposed slightly apart from the substrate 6.

Thereafter, the position of the arms 5 when the semiconductor laser element 2 is disposed at the predetermined optical position is calculated from the present spatial coordinate (x, y, z) and stores the result in a storage portion of the assembly control device. Thus, the positioning of the semiconductor laser element 2 is performed.

Thereafter, the arms 5 holding the spacer 3 are temporarily lifted to move the spacer 3 away from the substrate 6, and the spacer 3 is continuously held by the arms 5.

Thereafter, a predetermined amount of solder is placed on the substrate 6, and, as shown in FIG. 7B, a part of the substrate 6 that is exposed to the outside of the case 9 is locally heated with, for example, a condensed beam by the use of a xenon lamp so as to melt the solder on the substrate 6 quickly. As a result, the substrate 6 for mounting the spacer 3 to which the semiconductor laser element 2 is fixed is soldered preliminarily.

Herein, since the substrate 6 made of copper is much greater in thermal conductivity than the case 9 made of ceramic, the part of the substrate 6 that is exposed to the outside of the case 9 is quickly heated by raising the temperature of the condensed beam even if the substrate 6 is thick. Additionally, since the case 9 is much lower in thermal conductivity than the substrate 6, the heat applied to the substrate 6 by the condensed beam does not diffuse into the case 9, and, therefore, is efficiently transmitted to the solder placed on the substrate 6. As a result, the solder on the substrate 6 is always promptly melted. The dotted line in FIG. 7B indicates the spatial position of the semiconductor laser element 2 that has undergone the positioning at the predetermined optical position in FIG. 7A and the spatial position of the spacer 3 that fixes the semiconductor laser element 2.

Thereafter, the arms 5 are moved to the spatial coordinate (x, y, z) that has been stored in the storage portion as shown in FIG. 7C, and the spacer 3 is joined to the substrate 6 with melting solder in a state in which the semiconductor laser element 2 fixed to the spacer 3 that the arms 5 are holding is disposed at a predetermined optical position. Thereafter, heating by the condensed beam is stopped to cool the solder, thereby fixing the spacer 3 to the substrate 6. In this situation, the arms 5 hold the spacer 3 at the predetermined position at least until the spacer 3 is completely fixed to the substrate 6.

It is noted that the solder placed on the substrate 6 must be in an amount large enough to close up a gap between the spacer 3 that fixes the semiconductor laser element 2 disposed at the predetermined optical position and the substrate 6.

The solder that has melted by heating is pushed to the periphery of the spacer 3 by the substrate 6. However, as shown in FIG. 7C, the flow of the solder is blocked by the sidewall of the hole of the case 9 without careless extension when soldering. Therefore, the spacer 3 is reliably soldered with the substrate 6.

Thereby, the semiconductor laser element 2 fixed to the spacer 3 is fixed to the substrate 6 disposed at the predetermined position in the case 9, and, as a result, the semiconductor laser element 2 is promptly and reliably mounted at a predetermined optical position in the case 9.

Next, the spacer 3 to which the semiconductor laser element 2 is fixed is fixed to the substrate 6 with solder, and the arms 5 stop holding the spacer 3. Thereafter, the spacer 10 to which the semiconductor laser element 8 is fixed is held by the arms 5.

As mentioned above, the arms 5 are made of conductive material. But, since the spacer 10 is made of aluminum nitride that is an electrically insulating material, an electric current does not run through both the arm 5 and the spacer 10 when the arms 5 hold the spacer 10. Therefore, when the arms 5 hold the spacer 10, two contact fingers (not shown) of the assembly control device are electrically connected to the positive electrode 8b and the negative electrode 8c, respectively, of the semiconductor laser element 8.

Thereafter, the assembly control device spatially and properly moves the arms 5, and thereby, as shown in FIG. 8A, the spacer 10 to which the semiconductor laser element 8 is fixed is moved directly over the substrate 6, which is fixed to the case 9 and on which the spacer 10 is to be mounted. Thereafter, the electrical input is supplied to the semiconductor laser element 8 through the two contact fingers that are electrically connected to the respective electrodes of the semiconductor laser element 8, and a laser beam is emitted from the semiconductor laser element 8 to the prism.

Thereafter, the arms 5 are spatially and properly moved while holding the spacer 10, and the position of the semiconductor laser element 8 is adjusted to allow the laser beam from the semiconductor laser element 8 to appropriately strike the predetermined optical system formed by the other optical components in the case 9.

This adjustment is carried out based on the output of the received light of the OEIC obtained when the laser beam emitted from the semiconductor laser element 8 is caused to strike the optical system formed by the optical components in the case 9 and by the collimating lens, the mirror, the objective lens, etc., disposed at the predetermined positions of the assembly control device and is received by the OEIC in the case 9. Accordingly, the semiconductor laser element 8 fixed to the spacer 10 is disposed at a predetermined optical position that has no axial deviation with respect to the aforementioned predetermined optical system and is proper for the travelling direction of the laser beam. FIG. 8A shows this state. The spacer 10 is disposed slightly apart from the substrate 6.

Thereafter, the position of the arms 5 when the semiconductor laser element 8 is disposed at the predetermined optical position is calculated from the present spatial coordinate (x, y, z) and stores the result in a storage portion of the assembly control device. Thus, the positioning of the semiconductor laser element 8 is performed.

Thereafter, the arms 5 holding the spacer 10 are temporarily lifted to move the spacer 10 away from the substrate 6, and the spacer 10 is continuously held by the arms 5.

Thereafter, a predetermined amount of solder is placed on the substrate 6, and, as shown in FIG. 8B, a part of the substrate 6 that is exposed to the outside of the case 9 is locally heated with, for example, a condensed beam by the use of a xenon lamp so as to melt the solder on the substrate 6 quickly. As a result, the substrate 6 for mounting the spacer 10 to which the semiconductor laser element 8 is fixed is soldered preliminarily.

Herein, since the substrate 6 made of copper is much greater in thermal conductivity than the case 9 made of ceramic, the part of the substrate 6 that is exposed to the outside of the case 9 is quickly heated by raising the temperature of the condensed beam even if the substrate 6 is thick. Additionally, since the case 9 is much lower in thermal conductivity than the substrate 6, the heat applied to the substrate 6 by the condensed beam can hardly diffuse into the case 9.

Therefore, the solder, which is fixedly joining the spacer 3 fixing the semiconductor laser element 2 that has already been mounted at a predetermined optical position and the substrate 6 together, is not softened and does not flow by the heat of the substrate 6 applied by the condensed beam. As a result, without softening or flowing of the solder as an adhesive material that has already solidly cohered to the other substrate fixed to the case 9, the heat of the substrate 6 applied by the condensed beam is efficiently transmitted to the solder placed on the substrate 6 being heated. Therefore, only this solder can be melted promptly and infallibly. The dotted line in FIG. 8B indicates the spatial position of the semiconductor laser element 8 that has undergone positioning at the predetermined optical position in FIG. 8A and the spatial position of the spacer 10 that fixes the semiconductor laser element 8.

Thereafter, the arms 5 are moved to the spatial coordinate (x, y, z) that has been stored in the storage portion as shown in FIG. 8C, and the spacer 10 is joined to the substrate 6 with melting solder in a state in which the semiconductor laser element 8 fixed to the spacer 10 that the arms 5 are holding is disposed at a predetermined optical position. Thereafter, heating by the condensed beam is stopped to cool the solder, thereby fixing the spacer 10 to the substrate 6. In this situation, the arms 5 hold the spacer 10 at the predetermined position at least until the spacer 10 is completely fixed to the substrate 6.

Also in this example, the solder placed on the substrate 6 must be in an amount large enough to close up a gap between the spacer 10 that fixes the semiconductor laser element 8 disposed at the predetermined optical position and the substrate 6.

The solder that has melted by heating is pushed to the periphery of the spacer 10 by the substrate 6. However, as shown in FIG. 8C, the flow of the solder is blocked by the sidewall of the hole of the case 9 without careless extension when soldering. Therefore, the spacer 10 is reliably soldered with the substrate 6.

Thereby, the semiconductor laser element 8 fixed to the spacer 10 is fixed to the substrate 6 disposed at the predetermined position in the case 9, and, as a result, the semiconductor laser element 8 is promptly and reliably mounted at a predetermined optical position in the case 9.

According to the aforementioned method, the semiconductor laser element 2 and the semiconductor laser element 8 can be mounted promptly and reliably at the predetermined optical positions, respectively, where the axial adjustment of the laser beam or the positional adjustment of the axial direction has been conducted with respect to the optical system formed by the other optical components disposed in the case 9 of the semiconductor module M2.

In the embodiments mentioned above, the semiconductor laser element 2 is made up of the laser chip 2a, the positive electrode 2b, the negative electrode 2c, and the submount 2d, and, by joining the submount 2d to the surface of the spacer 3 serving as a holding member by solder, the semiconductor laser element 2 is fixed to the spacer 3. Likewise, the semiconductor laser element 8 is made up of the laser chip 8a, the positive electrode 8b, the negative electrode 8c, and the submount 8d, and, by joining the submount 8d to the surface of the spacer 10 serving as a holding member by solder, the semiconductor laser element 8 is fixed to the spacer 10. However, the semiconductor laser elements and the holding members of the present invention are not limited to this arrangement.

For example, an arrangement may be made in such a way that the laser chip 2a is caused to serve as the semiconductor laser element of the present invention, and the spacer 3, to which the submount 2d having the positive electrode 2b and the negative electrode 2c is beforehand fixed, is caused to serve as the holding member of the present invention. In this example, the spacer 3 may be formed by a part of the submount 2d, or the submount 2d may be formed by a part of the spacer 3.

Likewise, an arrangement may be made in such a way that the laser chip 8a is caused to serve as the semiconductor laser element of the present invention, and the spacer 10, to which the submount 8d having the positive electrode 8b and the negative electrode 8c is beforehand fixed, is caused to serve as the holding member of the present invention. In this example, the spacer 10 may be formed by a part of the submount 8d, or the submount 8d may be formed by a part of the spacer 10.

What is claimed is:

1. A semiconductor module comprising:
    a case;
    a base member fixedly held in the case;
    a holding member for fixedly holding a semiconductor laser element;
    a hole formed in the case opposite the holding member for communicating with the outside of the case and exposing a bottom part of the base member to the outside of the case to provide heat removal; and
    a thermal adhesive member having thermal conductivity and disposed between the holding member and the base member, the thermal adhesive member being meltable when radiation is provided through the hole thereto.

2. A semiconductor module according to claim 1, wherein the base member has greater thermal conductivity than the case.

3. A semiconductor module according to claim 1, wherein the semiconductor module has a plurality of sets each having the holding member, the base member, the hole and the thermal adhesive member in the case.

4. A semiconductor module according to claim 1, further comprising an optical system guiding a laser beam emitted from the semiconductor laser element to outside of the semiconductor module, the optical system having optical components disposed in the case.

5. A mounting method of a semiconductor laser element of a semiconductor module, for mounting the semiconductor laser element at an optical position where predetermined optical adjustment has been carried out with respect to an optical system formed by optical components disposed in a case of the semiconductor module, the mounting method comprising the steps of:

providing the case with a base member fixedly held therein and a hole formed in the case opposite the holding member for communicating with the outside of the case to expose a bottom part of the base member to the outside of the case to provide heat removal;

providing a holding member fixedly holding the semiconductor laser element;

providing a meltable thermal adhesive member having thermal conductivity and disposing the thermal adhesive member between the holding member and the base member, positioning the base member so that the semiconductor laser element is placed at the optical position; and heating the base member by radiation provided through said hole formed in the case.

6. A mounting method according to claim 5, wherein the base member has greater thermal conductivity than the case.

7. A mounting method according to claim 5, further comprising providing the semiconductor module with a plurality of sets each having the holding member, the base member, the hole and the thermal adhesive member in the case.

8. A mounting method according to claim 5, further comprising providing the semiconductor module with an optical system guiding a laser beam emitted from the semiconductor laser element to outside of the semiconductor module, the optical system having optical components disposed in the case.

* * * * *